United States Patent
Wang et al.

(10) Patent No.: US 8,303,133 B2
(45) Date of Patent: Nov. 6, 2012

(54) LIGHT EMITTING DIODE, BACKLIGHT MODULE, AND LIGHT TUBE

(75) Inventors: Hsiu-Tsu Wang, Jhonghe (TW); Chia-Hao Wu, Taipei (TW); Chih-Lung Liang, Taipei (TW); Chen-Hsiu Lin, Tucheng (TW); Chih-Chiang Kao, Kaohsiung (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 300 days.

(21) Appl. No.: 12/750,905

(22) Filed: Mar. 31, 2010

(65) Prior Publication Data

US 2011/0019397 A1 Jan. 27, 2011

(30) Foreign Application Priority Data

Jul. 24, 2009 (CN) .......................... 2009 1 0041445

(51) Int. Cl.
*F21S 4/00* (2006.01)

(52) U.S. Cl. ........................................ 362/225; 362/555
(58) Field of Classification Search .................. 362/555, 362/971, 221, 223, 255
See application file for complete search history.

(56) References Cited

U.S. PATENT DOCUMENTS

| | | | | |
|---|---|---|---|---|
| 2002/0085390 A1* | 7/2002 | Kiyomoto et al. | ............ | 362/555 |
| 2010/0195335 A1* | 8/2010 | Allen et al. | .................. | 362/309 |

* cited by examiner

*Primary Examiner* — David V Bruce
(74) *Attorney, Agent, or Firm* — Li & Cai Intellectual Property (USA) Office

(57) ABSTRACT

A light emitting diode includes: a base with a concave portion; a light emitting chip disposed in the concave portion; an encapsulating layer filled in the concave portion; and an optical adjusting element disposed on the light emitting chip. Herein, the light emitting diode has a batwing distribution in a horizontal view angle, and the light emitting diode has a Lambertian distribution in a vertical view angle thereof.

18 Claims, 8 Drawing Sheets

LIGHT EMITTING DIODE, BACKLIGHT MODULE, AND LIGHT TUBE

BACKGROUND OF THE INVENTION

1. Field of the Invention

The present invention is a light emitting diode, a backlight module, and a light tube thereof; especially, the present invention relates to a light emitting diode, a backlight module, and a light tube thereof having different light distributions in horizontal and the vertical view angles.

2. Description of Related Art

Light emitting diodes with quality of small sizes, light weights and a high response rate are widely applied. For example, white LEDs have been used as a light source in backlight modules, lighting systems and optical projectors recently.

In general, the reflection rate is reciprocal to the optical coupling ratio, in other words, the optical coupling ratio is decreasing with the increasing reflection rate. FIG. 2 shows the simulation of the reflection rate and the incident angle of LEDs when the LEDs are applied in the backlight module. As shown in FIG. 2, when the incident angle of LEDs is larger than 60 degree, the reflection rate is highly increased and the optical coupling ratio is reduced; therefore, the optical coupling ratio of white LEDs is 87%.

As shown in FIG. 1, the encapsulating layer of the white LED 11 of the backlight module 10 of LCD is a circular structure so that the white LED 11 provides a condensing light distribution (i.e., Lambertian distribution) which is means that the light intensity is decreased from the center to the edge. Therefore, the center of each white LED 11 has the highest light intensity and the areas between the adjacent white LEDs 11 have lower light intensity. Thus, there is the light distribution with non-uniformity in the backlight module 10 to result in the hotspot problem.

Similarly, the lighting system has darker areas between the adjacent white LEDs 11 due to the Lambertian distribution of LEDs. Thus, the lighting system has spaced lighter and darker areas to cause the uncomfortness of users.

The view angle of the traditional LEDs is about 120 degree and is not suitable for the optical engine of the projector (i.e., the input angle of the optical is about 60 degree). Therefore, the view angle of LEDs has to be adjusted to apply for the projector. However, the adjustment of the view angle results in the depression of light usage rate. In addition, it is necessary to convert the symmetric circle distribution of traditional LEDs into non-symmetric distribution of 16:9 for meeting the requirement of projector (i.e., the projected image is 16:9). An integration tunnel or a micro-lens array is used for convert the light distribution. However, the usage of the integration tunnel or a micro-lens array will result in the light loss and increase the volume of the projector.

Therefore, in the backlight application, the optical coupling rate cannot be improved because of the Lambertian distribution of LEDs. Furthermore, the hotspot problem occurs due to the non-uniformity of the lights. On the other hand, the glare issue and the low optical coupling rate occur in the lighting system. Moreover, the traditional LEDs will cause the low light usage rate in the optical projectors and the solution for the problems further results in another issue, such that the optical path is increased or the size of the projector is increased.

Consequently, with regard to the resolution of defects illustrated hereinbefore, the inventors of the present invention propose a reasonably designed solution of changing the light distribution for effectively eliminating such defects.

SUMMARY OF THE INVENTION

The objective of the present invention is to provide a light emitting diode characterized in that the light emitting diode provides a batwing distribution in the horizontal view angle and a Lambertian distribution (condensing distribution) in the vertical view angle. Moreover, the backlight module and the light tube having the light emitting diode of the present invention are introduced hereinafter.

To achieve the objective described as above, the present invention discloses a light emitting diode, including: a base with a concave portion; a light emitting chip disposed in the concave portion; an encapsulating layer filled in the concave portion; and an optical adjusting element disposed on the light emitting chip. Herein, a first light distribution of the light emitting diode in a horizontal view angle is different from a second light distribution of the light emitting diode in a vertical view angle.

For example, the light emitting diode provides a batwing distribution in the horizontal view angle and a Lambertian distribution (condensing distribution) in the vertical view angle so as to improve the uniformity of the combined light distribution. The lights in the vertical view angle are limited to be smaller than 60 degree. Furthermore, the batwing distribution in the horizontal view angle can be used for solving the hotspot problem in the backlight module and improving the optical coupling ratio. On the other hand, the glare issue of the lighting unit is also solved. Accordingly, the optical coupling ratio of the lighting unit is increased for the reason of high optical coupling ratio of the light emitting diode of the present invention. The light emitting diode of the invention provides a non-symmetric circle distribution and is suitable for an application of projectors. In addition, the projector can output images of 16:9 by adjusting the length of the long axis 203 and the short axis 204, the width L of concavity 201 and the curvature of the inclined-surface with semi-elliptic shape.

In order to further appreciate the characteristics and technical contents of the present invention, references are hereunder made to the detailed descriptions and appended drawings in connection with the present invention. However, the appended drawings are merely shown for exemplary purposes, rather than being used to restrict the scope of the present invention.

DETAILED DESCRIPTION OF THE PREFERRED EMBODIMENTS

Figure 1:
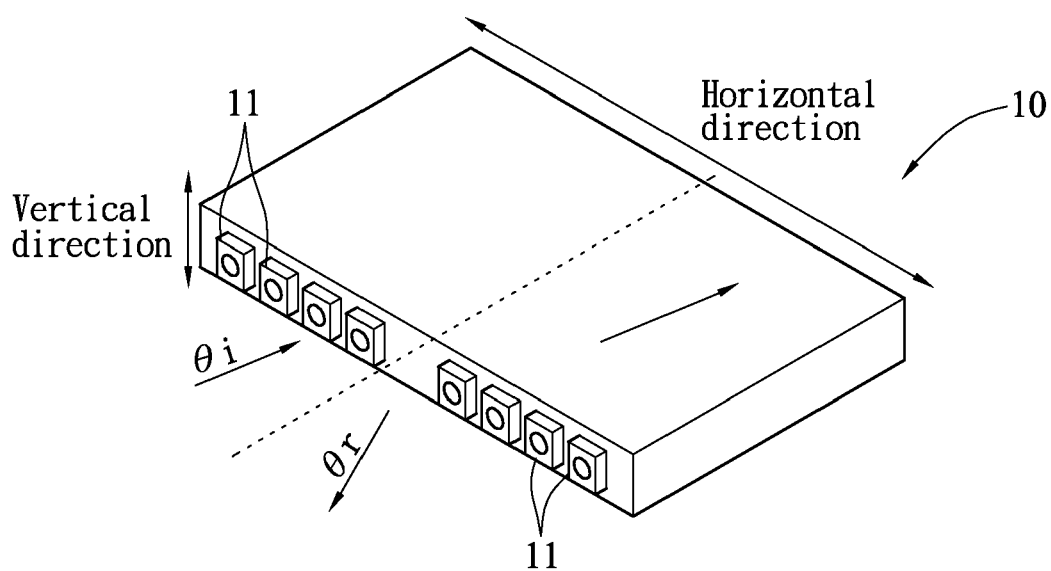
FIG. 1 is a structural diagram of the traditional backlight module.
Figure 2:
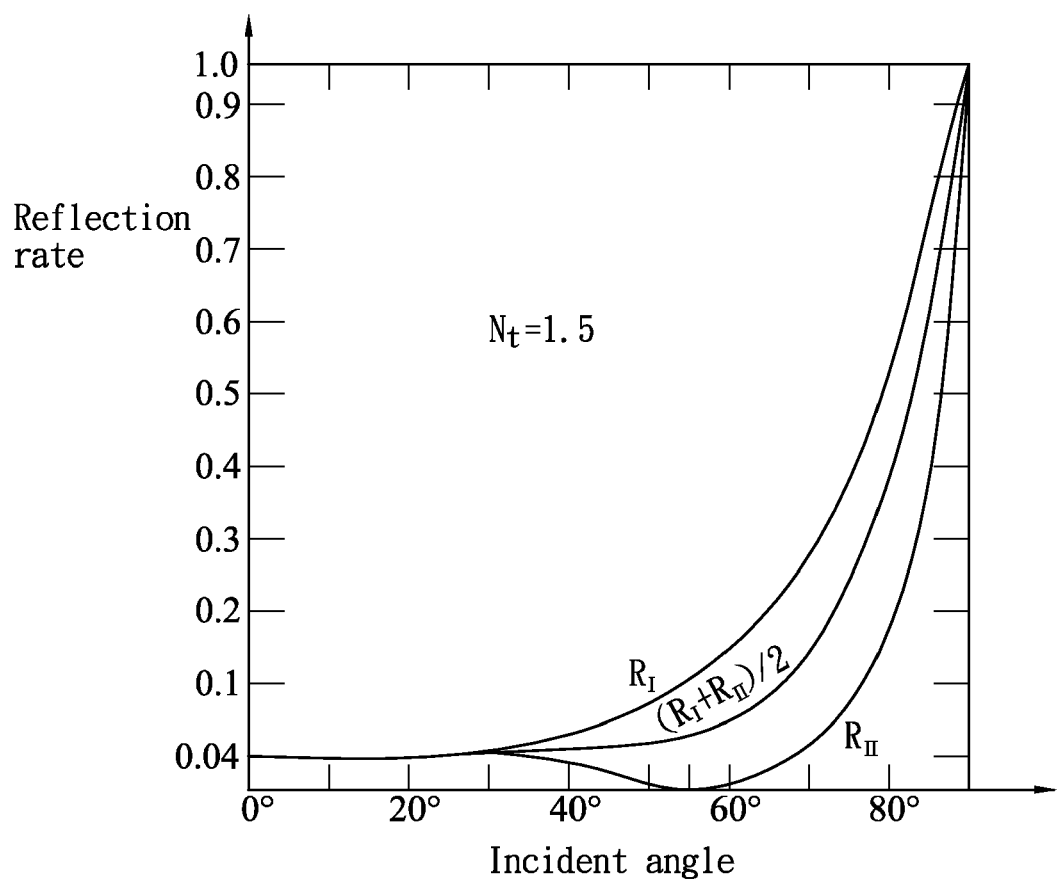
FIG. 2 is a simulation diagram showing the relation of the reflection rate and the incident angle of LEDs when the LEDs are applied in the traditional backlight module.
Figure 3:
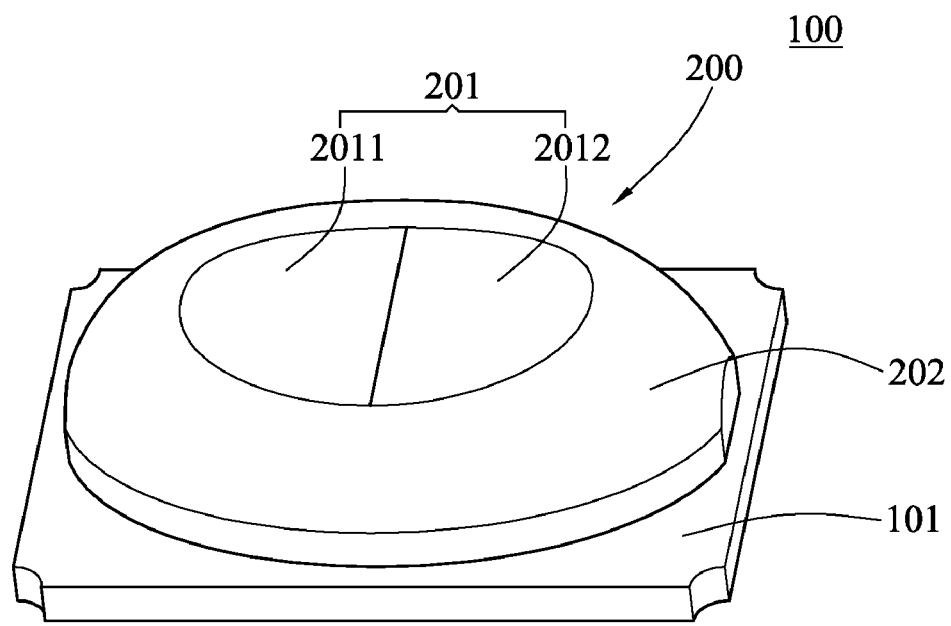
FIG. 3 is a structural diagram of the light emitting diode according to the present invention.
Figure 4:
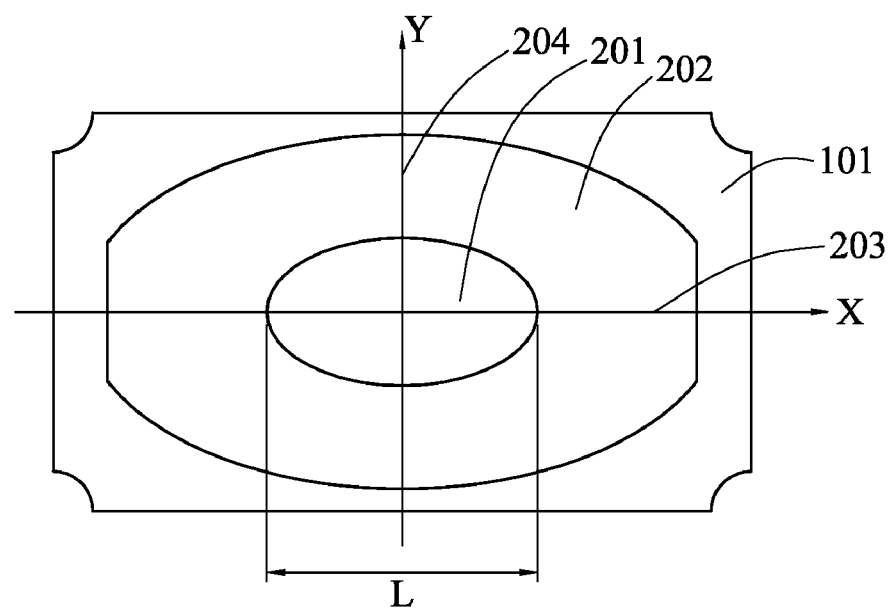
FIG. 4 is a top view of the light emitting diode according to the present invention.
Figure 5:
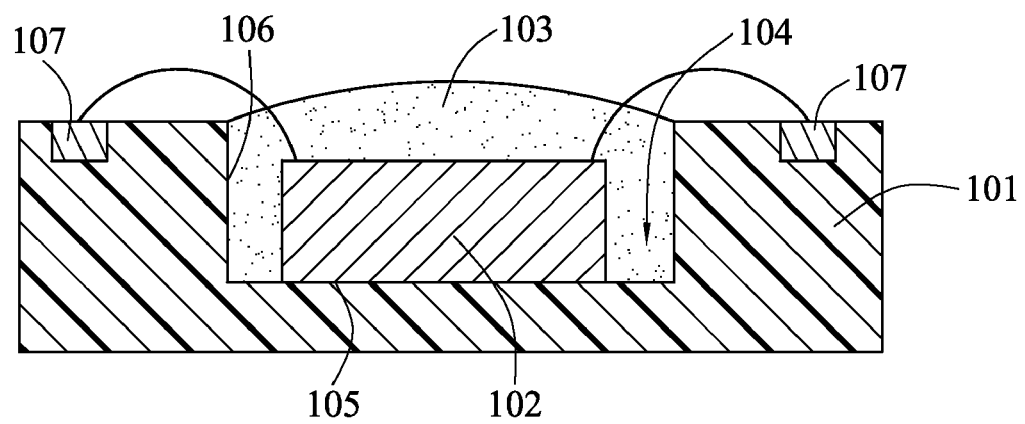
FIG. 5 is a cross-sectional diagram of the light emitting diode according to the present invention.

Refer now to FIG. 3-5, the preferred embodiment of the present invention provides a light emitting diode 100.

The light emitting diode 100 includes a base 101, a light emitting chip 102, and an encapsulating layer 103. The base 101 has a receiving space thereon, and the receiving space is a concave portion 104 formed concavely from the upper surface of the base 101. The concave portion 104 has a bottom surface 105 and a side wall 106 surrounding the bottom surface 105. In other words, the bottom surface 105 and the side wall 106 are constructed to define the concave portion 104. The light emitting chip 102 is mounted on the bottom surface 105 of the concave portion 104. Furthermore, the base 101 has at least one conducive pad 107 which is connected to the light emitting chip 102 so that the voltage and controlling signals can be provided to the light emitting chip 102. The encapsulating layer 103 is filled in the concave portion 104 and covers the top and side surfaces of the light emitting chip 102.

The light emitting diode 100 further has an optical adjusting element 200 located on the base 101 and be packaged with the base 101. The optical adjusting element 200 is made of transparent materials and includes light penetrability, and a first light distribution of the light emitting diode 100 in the horizontal view angle is different from a second light distribution of the light emitting diode 100 in the vertical view angle after the light emitted from the light emitting chip 102 passes through the optical adjusting element 200. In the embodiment, the light distribution in the horizontal view angle is a batwing distribution and the light distribution in a vertical view angle is a Lambertian distribution.

Figure 8A:
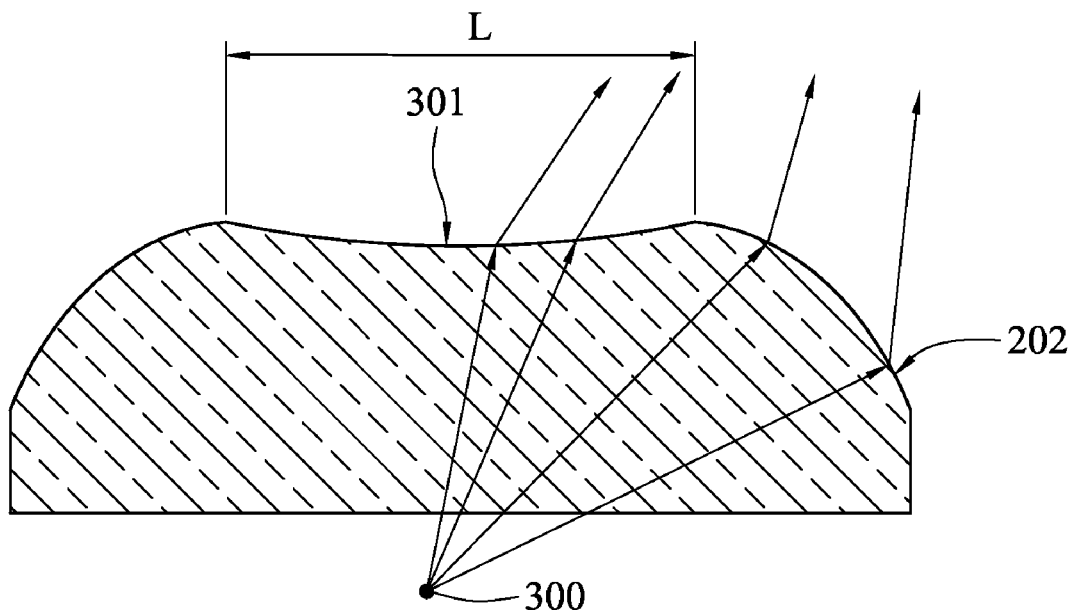
FIG. 8A is a cross-sectional diagram showing the optical adjusting element along the long axis, and further showing the optical paths according to the present invention.

Please refer to FIG. 4 or FIG. 8A, the optical adjusting element 200 is substantial a semi-elliptic shape and includes a semi-ellipsoid 202 and a concavity 201. The concavity 201 is concavely formed on a top surface of the optical adjusting element 200 and is connected with the semi-ellipsoid 202 therearound. That is to say, the semi-ellipsoid 202 has a hollow part on the top surface of the optical adjusting element 200 to connect with the periphery of the concavity 201. The semi-ellipsoid 202 has a long axis 203 and a short axis 204, and the two axes 203, 204 are perpendicular to each other. In the embodiment, the long axis 203 is a horizontal axis (X axis) and the short axis 204 is a vertical axis (Y axis). The structures of the optical adjusting element 200 are clearly described as following to explain the two different light distributions of the light emitting diode in the two view angles.

As shown in FIG. 3, the concavity 201 is located over the light emitting chip 102 and the geometry center of the concavity 201 aligns with the light emitting chip 102 so as to adjust the light distribution. The concavity 201 with an elliptic shape in FIG. 4 is formed of two inclined-surfaces 2011, 2012 with semi-elliptic shape. The height of the concavity 201 is increasing from the geometry center to the peripheral edge along the direction of long axis 203. Furthermore, the cross-sections of the semi-ellipsoid 202 along directions of the long axis and the short axis of the semi-ellipsoid respectively have protruded shapes. In another embodiment, the concavity 201 with a circle shape is formed of two inclined-surfaces with semi-circle shape.

Figure 6:
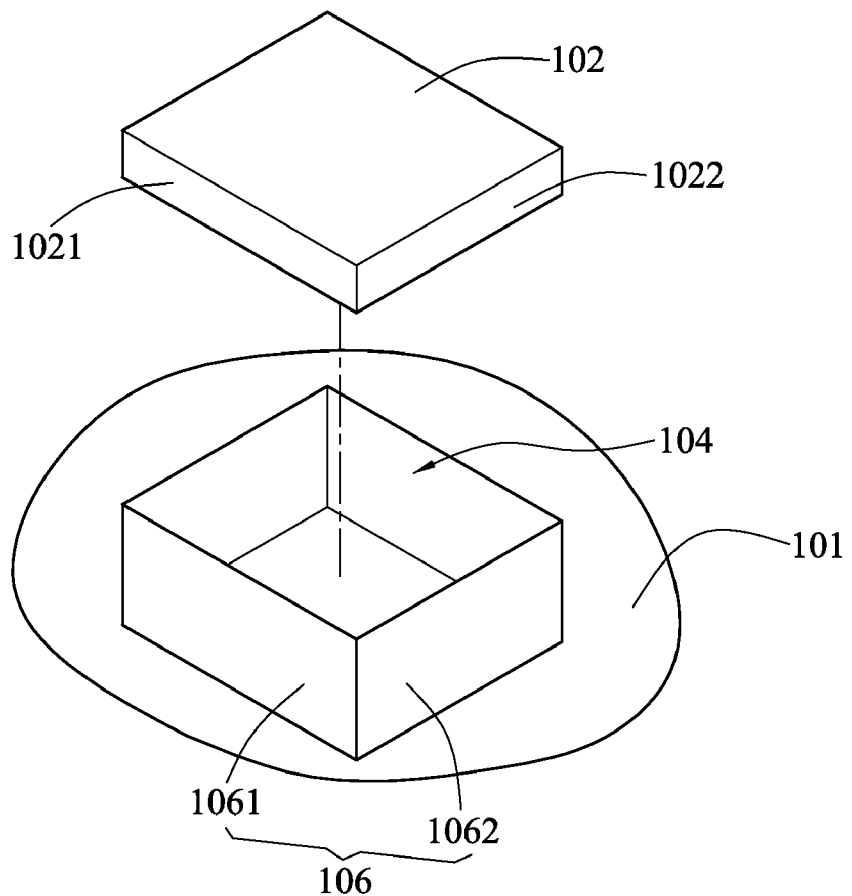
FIG. 6 is a schematic diagram showing the light emitting chip received in the concave portion of the base according to the present invention.

For controlling the light with high efficiency, outer peripheral edges of the concave portion 104 are corresponding to outer peripheral edges of the light emitting chip 102. Please refer to FIG. 6, the light emitting chip 102 is a rectangular solid with two parallel and spaced long side surfaces 1021 and two parallel and spaced short side surfaces 1022. Therefore, the concave portion 104 is defined as a chamber with a rectangular-solid shape having side walls 106. The side walls 106 have two parallel and spaced long side walls 1061 and two parallel and spaced short side walls 1062. Moreover, the long side surface 1021 of the light emitting chip 102 is parallel to the long side wall 1061 of the concave portion 104, and the short side surface 1022 of the light emitting chip 102 is parallel to the short side wall 1062 of the concave portion 104.

Figure 9:
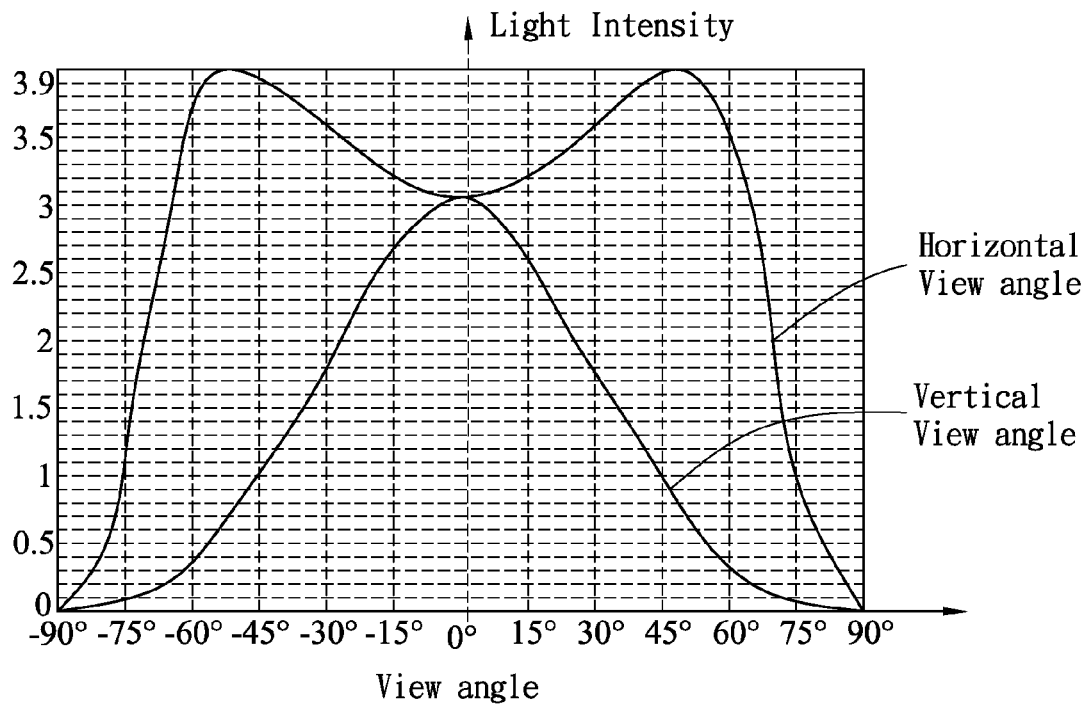
FIG. 9 shows the light distributions in the horizontal and vertical view angle of the light emitting diode according to the present invention.

The distance between the two short side surfaces 1022, or between the two long side surfaces 1021 and the distance between two short side walls 1062, or between the long side walls 1061 are limited for controlling the lights emitting from a top surface of the light emitting chip 102 so as to provide a Lambertian distribution (as shown in FIG. 9) in the vertical view angle (i.e., along Y axis in FIG. 4).

Figure 7A:
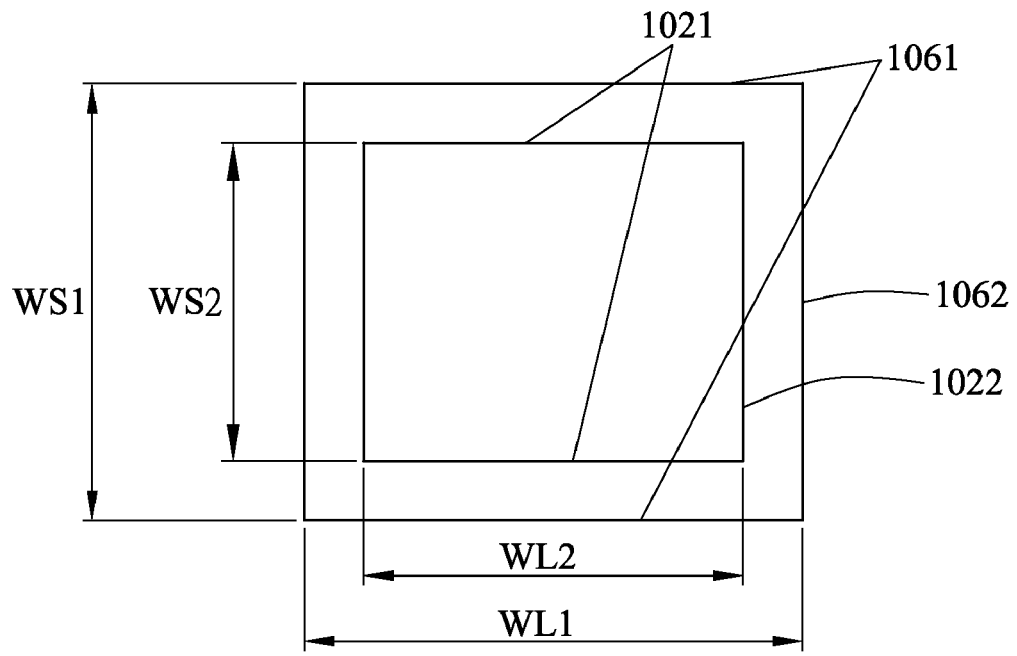
FIG. 7A is a schematic diagram of the light emitting chip and the concave portion of the base according to the present invention.

Please refer to FIG. 7A, a difference between a width WS1 of the two long side walls 1061 and a width WS2 of the two long side surfaces 1021 is less than 0.6 mm (i.e., WS1−WS2<0.6 mm) Similarly, a difference between a width WL1 of the two short side walls 1062 and a width WL2 of the two short side surfaces 1022 is less than 0.6 mm (i.e., WL1−WL2<0.6 mm) In the embodiment, the difference between WS1 and WS2 is 0.4 mm and the difference between WL1 and WL2 is also 0.4 mm.

Figure 7B:
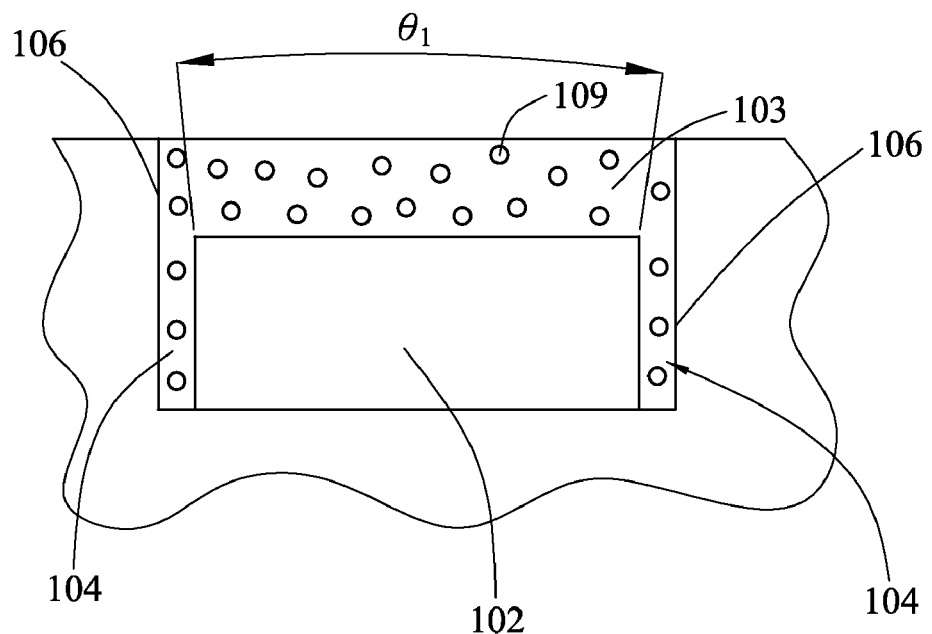
FIG. 7B is a cross-sectional diagram of the light emitting chip and the concave portion of the base according to the present invention.

Please refer to FIG. 7B, because the side walls 106 of the concave portion 104 are parallel to the side surfaces of the light emitting chip 102, the lights emitted from the side surfaces of the light emitting chip 102 are limited and reflected between the side walls 106 (including two long side walls 1061 and two short side walls 1062) of the concave portion 104 and the side surfaces (including two long side surfaces 1021 and two short side surfaces 1022) of the light emitting chip 102. Alternatively, the lights emitted from the side surfaces of the light emitting chip 102 may be converted into another energy type. Thus, the lights observed by users are emitted from the top of the light emitting chip 102. The sizes, especially the widths and the heights of the light emitting chip 102 and the concave portion 104 are controlled to limit the lights emitted from the top of the light emitting chip 102 are ranged in the angle θ1, in which the angle θ1 is less than or equal to 120°. Accordingly, the light emitting chip 102 emits lights as a light source with high light concentration. In addition, the encapsulating layer 103 further has phosphor powders 109 for wavelength conversion and the encapsulating layer 103 with the phosphor powders 109 is filled in the concave portion 104 to cover the top and the side surfaces of the emitting chip 102. For example, the light emitting chip 102 can be an blue-light LED with a wavelength of 400 nm to 470 nm and the phosphor powders 109 can be yellow-light phosphor powders for converting blue light to yellow light with a wavelength of 520 nm to 570 nm, and therefore, the light emitting diode 100 can output white lights by mixing the blue and yellow lights. However, the present invention is not restricted thereby.

With regards the white LEDs, the top of the light emitting chip 102 contributes the most light intensity of the emitted light but the side surfaces of the light emitting chip 102 contributes almost nothing of the emitted light. Therefore, the light emitting chip 102 performs as a light source with high light concentration.

By combining the two different light distributions in the horizontal view angle (X axis) and in the vertical angle (Y axis), the uniformity of the lights can be improved. A normal LED is taken as an example and the white LED has the same application.

Please refer to FIG. 8A, the optical paths through the optical adjusting element 200 along the long axis 203 are shown. The concavity 201 in FIGS. 3 and 4 is seen as a concave arc edge 301 along the long axis 203. On the other hand, the concavity 201 in FIGS. 3 and 4 is seen as a planar edge 302 along the short axis 204, as shown in FIG. 8B.

Lights are emitted from a point light source 300 (i.e., the light emitting chip 102) and the lights along the long axis 203 "meet" the concave arc edge 301. The lights refract at the concave arc edge 301 and the refractions are different depending on the different concave areas of the concave arc edge 301 so as to diverge lights with different degrees. However, the lights passing through the semi-ellipsoid 202 of the optical adjusting element 200 are condensed with different degrees depending on different protruding areas of the protruding shape of the semi-ellipsoid 202. In other words, the semi-ellipsoid 202 performs as a convex lens. Because of the divergence of the concave arc edge 301 and the condensing lights of the semi-ellipsoid 202, the light intensity in the middle of the optical adjusting element 200 is smaller than that of the two sides of the optical adjusting element 200. In other words, the light intensity is increased to a maximum value from the center to the sides of the optical adjusting element 200. Further because the less amount of lights pass through the semi-ellipsoid 202 (i.e., the lights are limited in the angle θ1) and the condensing lights occurs at the semi-ellipsoid 202, the light intensity is decreased from the maximum value along the sides of the optical adjusting element 200. To sum up, the light intensity in the horizontal view angle increases to a maximum value from the center to the sides of the optical adjusting element 200, and then the light intensity in the horizontal view angle would decrease in further sides of the optical adjusting element 200. Consequently, the light distribution of the light emitting diode 100 is a batwing distribution along the horizontal view angle (X axis in FIG. 4) as shown in FIG. 9.

On the other hand, the width L of the concavity 201 can be adjusted to change the light intensity of the middle part of the batwing distribution. Because the concave arc edge 301 performs as a concave lens, adjusting the curvature of the inclined-surface with semi-elliptic shape or with semi-circle shape, the lengths of the long axis and the short axis of the inclined-surface with semi-elliptic shape, or the radius of the inclined-surface with semi-circle shape can change the curvature of concave arc edge 301 so as to obtain the batwing distribution with different shapes. In other words, the curvature of the inclined-surface 2011 or 2012 with semi-elliptic shape or with semi-circle shape, lengths of the long axis 203 and the short axis 204 of the inclined-surface 2011 or 2012 with semi-elliptic shape can be determined in a determination range between a maximal and a minimal function value of which the first light distribution of the light emitting chip 102 of the light emitting diode 100 in the horizontal view angle is different from the second light distribution of the light emitting chip 102 of the light emitting diode 100 in the vertical view angle. Similarly, a radius of the inclined-surface 2011 or 2012 with semi-circle shape can be determined in a determination range between a maximal and a minimal function value of which the first light distribution of the light emitting chip 102 of the light emitting diode 100 in the horizontal view angle is different from the second light distribution of the light emitting chip 102 of the light emitting diode 100 in the vertical view angle.

Figure 8B:
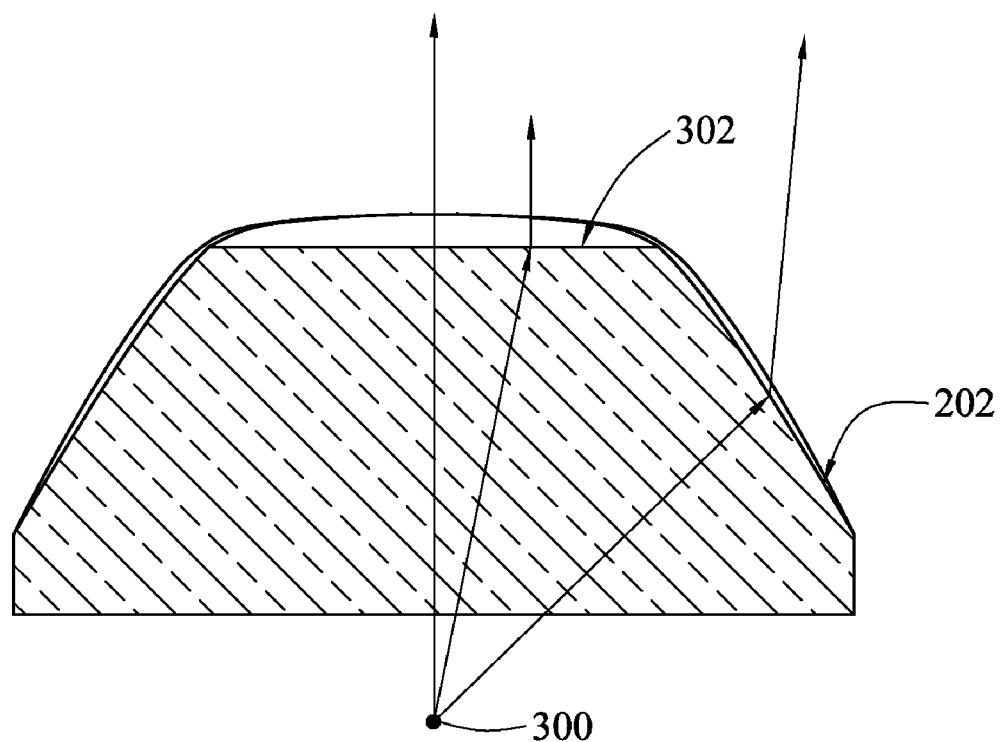
FIG. 8B is a cross-sectional diagram showing the optical adjusting element along the short axis, and further showing the optical paths according to the present invention.

Please refer to FIG. 8B, the optical paths through the optical adjusting element 200 along the short axis 204 are shown. The concavity 201 is seen as a planar edge 302 along the short axis 204. When lights are emitted from a point light source 300 (i.e., the light emitting chip 102), the lights along the short axis 204 "meet" the planar edge 302 so that the lights are refracted at the planar edge 302 and are condensed. Therefore, the light intensity is decreased from the center to the sides of the optical adjusting element 200 as shown in FIG. 9. In other words, the light distribution of the light emitting diode 100 along the vertical view angle (i.e. Y axis in FIG. 4) is a Lambertian distribution.

Comparing with the simple condensing light distribution of the traditional LED, the light emitting diode 100 provides a batwing distribution and a Lambertian distribution respectively in the horizontal view angle and the vertical view angle. Thus, the combined light distribution formed of the batwing distribution in the horizontal view angle and the Lambertian distribution in the vertical view angle can be one of a non-symmetric circle distribution and a non-symmetric elliptic distribution and the combined light distribution can provide uniform distribution of the light density.

Please refer to FIG. 9, the experimental combined light distribution is explained hereinafter. The batwing distribution in the horizontal view angle means that the light intensity increases from 0 degree to 50 degree and from 0 degree to −50 degree. On the other hand, the Lambertian distribution in the vertical view angle means that the light intensity decreases from the center to the edge. The batwing distribution and the Lambertian distribution are combined to obtain the improved-uniform light distribution.

Analyzing the light intensity of FIG. 9, the light intensity in the normal line (0 degree) of the light emitting diode 100 is 30% to 80% of the highest light intensity (the highest light intensity of the batwing distribution), and preferably the ratio is from 50% to 70%. Moreover, the highest light intensity of the light emitting diode 100 is distributed from 30 degree to 70 degree, and preferably the angle is from 45 degree to 55 degree in order to obtain the uniform light.

Figure 10A:
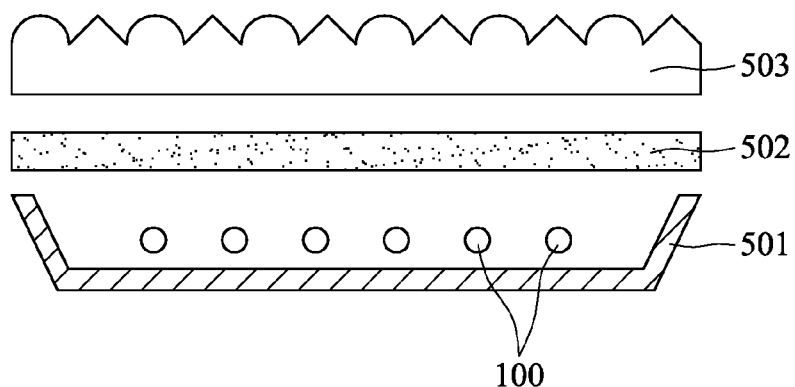
FIG. 10A is a cross-section diagram showing a backlight module including the light emitting diode according to the present invention.

Thus, by adjusting the position, length of the light emitting diode 100, the light emitting diode 100 of the present invention provides different light distributions, for example a non-symmetric circle distribution. As shown in FIG. 10A, the light emitting diode 100 could be applied in a backlight unit 500. The backlight unit 500 includes a reflecting sheet 501, a diffusing plate 502 disposed on the reflecting sheet 501, a prism sheet 503 disposed on the diffusing plate 502, and a plurality of light emitting diode 100 disposed between the reflecting sheet 501 and the diffusing plate 502. The lights generated from the light emitting diodes 100 are projected to a display panel (not shown) through the diffusing plate 502 and the prism sheet 503. The reflecting sheet 501 is used for reflecting the lights from the light emitting diodes 100 toward the diffusing plate 502 and the prism sheet 503 so as to utilize the light efficiently. There is a gap between the adjacent light emitting diodes 100 and a ratio of a height of the gap and a width of the gap is from 0.5 to 1. Therefore, the number of the light emitting diodes 100 can be reduced and the requirement of the light intensity and the light uniformity would be meet. Furthermore, the light of large incident angle is refracted in the more normal axis so as to reduce the light distribution according to Snell's Law. In other words, the light can be concentrated to increase the light intensity.

Figure 10B:
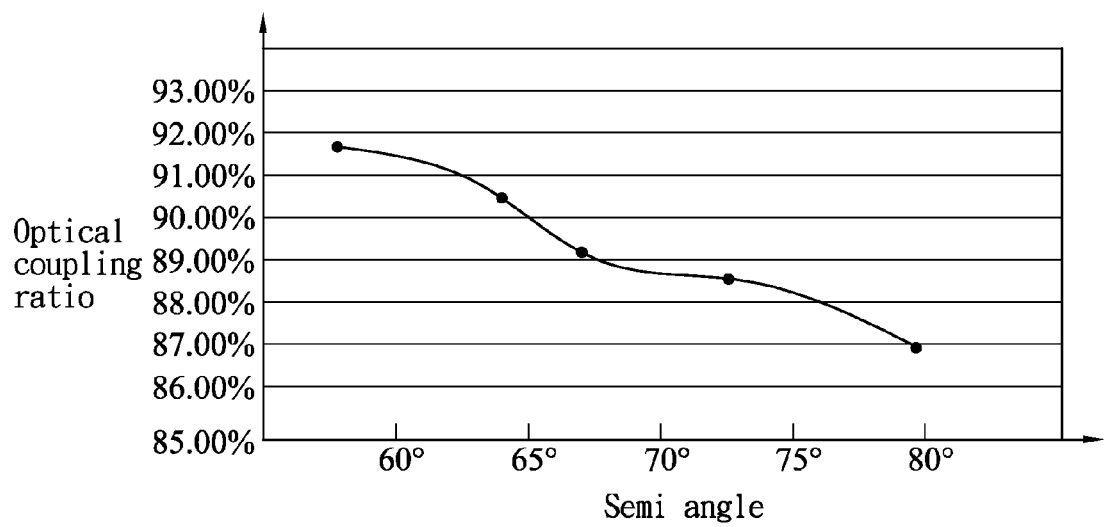
FIG. 10B shows the optical coupling rate with the horizontal view angle of the light emitting diode according to the present invention.
Figure 10C:
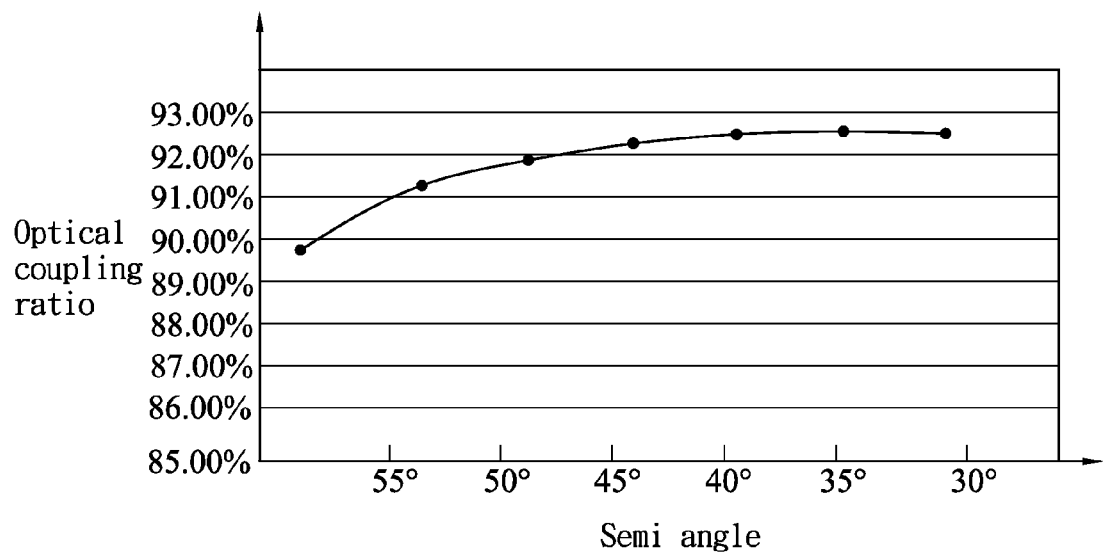
FIG. 10C shows the optical coupling rate with the vertical view angle of the light emitting diode according to the present invention.

When the light emitting diode 100 is applied in the backlight module 500, the length of the long axis 203 and the short axis 204 are adjusted, and the width L of concavity 201 is adjusted to 1.5 mm to obtain the light extraction ratio (i.e., optical coupling ratio) of 92.6% in the horizontal view angle of 120 degree and the vertical view angle of 80 degree, as shown in FIGS. 10B and 10C. On the other hand, the length of the long axis 203 and the short axis 204, the width L of the concavity 201 and the curvature of the inclined-surface with semi-elliptic shape are adjustable for improving the light uniformity and solving the problem of hotspot in the traditional backlight module.

Figure 11:
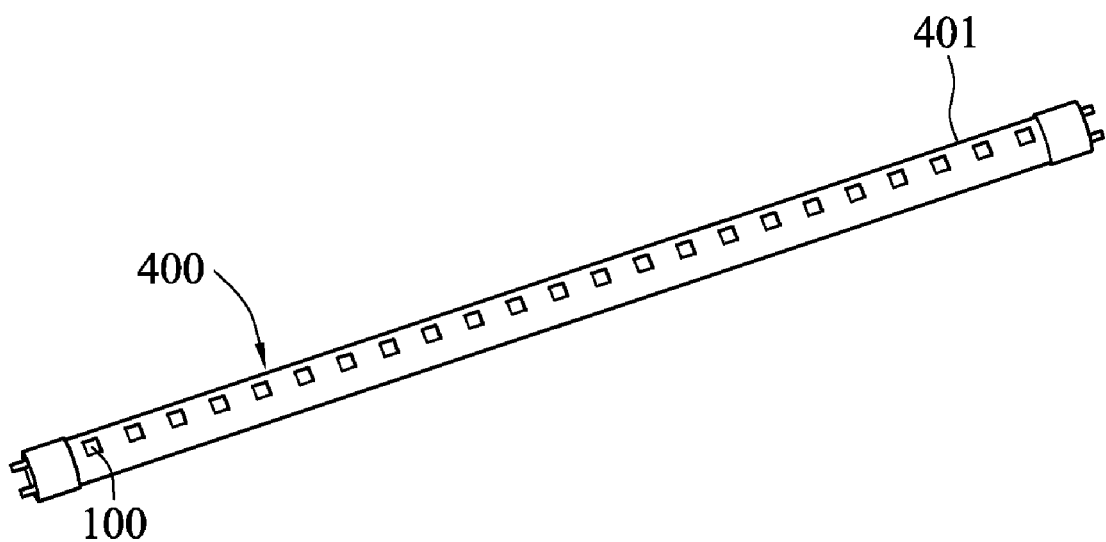
FIG. 11 is a structural diagram of the light tube including the light emitting diode according to the present invention.

As shown in FIG. 11, a light tube 400 is provided. The light tube 400 has a transparent tube 401 and a PCB (not shown) received inside the transparent tube 401. The light emitting diodes 100 of the present invention are mounted on the PCB inside the transparent tube 401 so as to provide lights. The light tube 400 provides lights with improved uniformity and the glare issue of the light tube with traditional LEDs.

The batwing distribution in the horizontal view angle and the Lambertian distribution in the vertical view angle are combined to obtain a non-symmetric circle distribution. Furthermore, the combined distribution of the light emitting diode 100 can be a non-symmetric elliptic distribution by adjusting the length of the long axis 203 and the short axis 204, the width L of concavity 201 and the curvature of the inclined-surface with semi-elliptic shape. The non-symmetric elliptic distribution is suitable for a projector so that the projector can output images of 16:9. Comparing to the integration tunnel and micro-lens array used in the traditional projector, the light emitting diodes 100 of the present invention directly project non-symmetric elliptic distribution lights; therefore, the size of the projector and the optical paths are not increased. Thus, the light dissipation is prevented.

In addition, the optical adjusting element 200 can be made of PMMA, epoxy resins, silicone, glass materials or polycarbonate (PC), but not restricted thereby.

The texts set forth hereinbefore illustrate simply the preferred embodiments of the present invention, rather than intending to restrict the scope of the present invention claimed to be legally protected thereto. All effectively equivalent changes made by using the contents of the present disclosure and appended drawings thereof are included within the scope of the present invention delineated by the following claims.

What is claimed is:

1. A light emitting diode, comprising:
   a base with a concave portion;
   a light emitting chip disposed in the concave portion;
   an encapsulating layer filled in the concave portion; and
   an optical adjusting element disposed on the light emitting chip so that a first light distribution of the light emitting diode in a horizontal view angle is different from a second light distribution of the light emitting diode in a vertical view angle, wherein the first light distribution is a batwing distribution and the second light distribution is a Lambertian distribution.

2. The light emitting diode according to claim 1, wherein the optical adjusting element includes a semi-ellipsoid and a concavity which is formed on a top surface of the optical adjusting element and connected with the semi-ellipsoid therearound.

3. The light emitting diode according to claim 2, wherein the concavity is formed of two inclined-surfaces with semi-elliptic shape or formed of two inclined-surfaces with semi-circle shape.

4. The light emitting diode according to claim 3, wherein a curvature of the inclined-surface with semi-elliptic shape or with semi-circle shape, lengths of the long axis and the short axis of the inclined-surface with semi-elliptic shape are determined in a determination range between a maximal and a minimal function value of which the first light distribution in the horizontal view angle is different from the second light distribution in the vertical view angle, and a radius of the inclined-surface with semi-circle shape is determined in a determination range between a maximal and a minimal function value of which the first light distribution in the horizontal view angle is different from the second light distribution in the vertical view angle.

5. The light emitting diode according to claim 2, wherein a cross-section of the concavity has a concave arc edge in a direction of a long axis of the semi-ellipsoid, a cross-section of the concavity has a planar edge in a direction of a short axis of the semi-ellipsoid, and cross-sections of the semi-ellipsoid in the directions of the long axis and the short axis thereof respectively have protruded shapes.

6. The light emitting diode according to claim 2, wherein a geometry center of the concavity aligns with the light emitting chip.

7. The light emitting diode according to claim 1, wherein the concave portion of the base has two parallel and spaced long side walls and two parallel and spaced short side walls, the light emitting chip has two parallel and spaced long side surfaces and two parallel and spaced short side surfaces, wherein the long side surface of the light emitting chip is parallel to the long side wall of the concave portion, and the short side surface of the light emitting chip is parallel to the short side wall of the concave portion.

8. The light emitting diode according to claim 7, wherein a difference between a width of the two long side walls and a width of the two long side surfaces is less than 0.6 mm, and a difference between a width of the two short side walls and a width of the two short side surfaces is less than 0.6 mm.

9. The light emitting diode according to claim 1, wherein a highest light intensity of the light emitting diode is distributed between 30 degree to 70 degree and the light intensity in a normal line is about from 30% to 80% of the highest light intensity.

10. The light emitting diode according to claim 9, wherein the highest light intensity of the light emitting diode is distributed between 45 degree to 55 degree and the light intensity in a normal line is about from 50% to 70% of the highest light intensity.

11. The light emitting diode according to claim 1, wherein the encapsulating layer further has phosphor powders for wavelength conversion.

12. The light emitting diode according to claim 1, wherein the first light distribution of the light emitting diode and the second light distribution of the light emitting diode are combined to obtain a combined light distribution which is one of a non-symmetric circle distribution and a non-symmetric elliptic distribution.

13. The light emitting diode according to claim 1, wherein outer peripheral edges of the concave portion are corresponding to outer peripheral edges of the light emitting chip.

14. A lighting device comprising a plurality of light emitting diodes of claim 1.

15. The lighting device according to claim 14, further comprising a reflecting sheet, a diffusing plate, wherein the light emitting diodes are disposed between the reflecting sheet and the diffusing plate.

16. The lighting device according to claim 14, wherein the two adjacent light emitting diodes have a gap therebetween, and a ratio of a height of the gap and a width of the gap is from 0.5 to 1.

17. The lighting device according to claim 14, further comprising a transparent tube and a PCB, wherein the light emitting diodes are mounting on the PCB and received inside the transparent tube.

18. A light emitting diode, comprising:
a base with a concave portion;
a light emitting chip disposed in the concave portion;
an encapsulating layer filled in the concave portion; and
an optical adjusting element disposed on the light emitting chip so that a first light distribution of the light emitting diode in a horizontal view angle is different from a second light distribution of the light emitting diode in a vertical view angle, wherein a highest light intensity of the light emitting diode is distributed between 30 degree to 70 degree and the light intensity in a normal line is about from 30% to 80% of the highest light intensity.

* * * * *